(12) United States Patent
Buresch

(10) Patent No.: US 7,189,630 B2
(45) Date of Patent: Mar. 13, 2007

(54) LAYER SEQUENCE FOR PRODUCING A COMPOSITE MATERIAL FOR ELECTROMECHANICAL COMPONENTS

(75) Inventor: Isabell Buresch, Illertissen (DE)

(73) Assignee: Wieland-Werke AG, Ulm (DE)

( * ) Notice: Subject to any disclaimer, the term of this patent is extended or adjusted under 35 U.S.C. 154(b) by 65 days.

(21) Appl. No.: 10/996,681

(22) Filed: Nov. 24, 2004

(65) Prior Publication Data

US 2005/0145997 A1 Jul. 7, 2005

(30) Foreign Application Priority Data

Nov. 28, 2003 (DE) ................. 103 55 724
Oct. 4, 2004 (EP) ................. 04023558

(51) Int. Cl.
*H01L 21/30* (2006.01)
(52) U.S. Cl. ................ 438/455; 257/E23.028
(58) Field of Classification Search ................ 438/455, 438/687; 428/647
See application file for complete search history.

(56) References Cited

U.S. PATENT DOCUMENTS

| 5,916,695 | A | 6/1999 | Fister et al. |
| 6,083,633 | A | 7/2000 | Fister et al. |
| 2003/0035977 | A1 | 2/2003 | Datta |
| 2003/0091855 | A1* | 5/2003 | Tanaka et al. ............ 428/647 |

FOREIGN PATENT DOCUMENTS

| DE | 3712691 | 6/1988 |
| JP | 64-064840 | 3/1989 |
| JP | 10-284667 | 10/1998 |

OTHER PUBLICATIONS

B. C. Scott and M. E. Warwick, The Solid-State Reaction of Copper and Tin: An Assessment of the Value of an Iron Barrier Layer, 1983, vol. 61, pp. 43-45, Transactions of the Institute of Metal Finishing.
European Search Report dated Mar. 29, 2005 (3 pages).

* cited by examiner

*Primary Examiner*—Alexander Ghyka
(74) *Attorney, Agent, or Firm*—Flynn, Thiel, Boutell & Tanis, P.C.

(57) ABSTRACT

The invention relates to a layer sequence on a substrate made from copper, a copper-based alloy, a copper-plated substrate or a nickel or a nickel-based alloy for production of a composite material, in which a covering layer, consisting of tin or a tin-based alloy, which is arranged at least over part of the substrate, a barrier layer, which is located between the substrate and the covering layer and is in direct contact with the substrate, the barrier layer consisting of at least one element selected from the group consisting of Fe, Co, Nb, Mo or Ta, and an intermediate layer and a reaction layer, which is located between the barrier layer and the covering layer, the intermediate layer consisting of at least one element selected from the group consisting of Cu and Ni. The reaction layer required between covering layer and intermediate layer consists of Ag, an Ag alloy or Pt and Pd and its alloys. Furthermore, the invention relates to a process for producing a composite material from the layer sequence with a subsequent heat treatment.

15 Claims, 1 Drawing Sheet

LAYER SEQUENCE FOR PRODUCING A COMPOSITE MATERIAL FOR ELECTROMECHANICAL COMPONENTS

The invention relates to a layer sequence on a substrate made from copper or a copper-based alloy, made from nickel or a nickel-based alloy or a copper-plated substrate for production of a composite material, and to a process for producing a composite material from the layer sequence.

During long-term age-hardening of Cu-based and Ni-based materials which have been tin-plated by hot-dip or electroplating processes and copper-plated substrates, intermetallic phases (IMPs), such as $Cu_3Sn$, $Cu_6Sn_5$ or $Ni_3Sn$, form as a result of diffusion processes.

Depending on the layer thickness of the tin plating and the process sequence used in terms of its time/temperature profile during the age hardening, pores may occur at the base material/coating interface, depending on the alloy composition. In the most unfavorable set of circumstances, the Sn layer may even flake off. Flaking of the Sn layer from the base material can lead to total failure of the module in particular when used in electromechanical components.

This formation of pores as a result of diffusion phenomena in the solid state is known as the Kirkendall effect and is based on the different diffusion rates of Sn and Cu and its alloying elements. The alloying elements which are present in the base material may accelerate or decelerate this effect.

It is in principle possible for an intermediate layer which inhibits the diffusion to be deposited directly onto the base material prior to the application of the Sn layer. This barrier layer is intended to prevent alloying elements from diffusing out of the base material into the Sn layer. The problematic growth of the CuSn or NiSn IMP is in this way prevented or at least decelerated. Some important layer properties which are responsible, for example, for good solderability are retained, whereas others, such as for example good bendability, may deteriorate, depending on the barrier layer and thickness selected.

Even if certain layer properties are ensured through the use of conventional barrier layers, the basic problem of the formation of pores through diffusion during long-term age-hardening at elevated temperature (e.g. 150° C./3000 h) remains. However, the risk of the coating flaking off the base material cannot be prevented by these standard intermediate layers in the case of Cu alloys.

The effect of a Fe barrier layer compared to a Cu barrier layer with regard to the growth rate of the Cu—Sn IMP is described in a publication by Scott, B. C. and Warwick, M. E. (Intern. Tin Res. Inst., Transact. of the Inst. of Met. Finishing, (1982), Vol. 61, pp. 44ff.).

The iron barrier layer used forms a $FeSn_2$ IMP at temperatures of 170° C. However, the thickness growth is correspondingly low, with the result that an effective barrier against the diffusion of Sn is only produced if it is free of pores. As soon as there are any pores in the Fe layer, a $Cu_6Sn_5$ IMP forms beneath the Fe layer, with the result that the Fe barrier layer flakes off the base material. Layers without any pores can only be achieved above a layer thickness of approximately 2 μm. Since in particular relatively thick Fe layers may present problems in the electronics industry, on account of the magnetic properties, this solution has hitherto been deprecated in practice.

Furthermore, document U.S. Pat. No. 5,916,695 has disclosed an Ni-containing intermediate layer which is arranged between a copper-containing substrate and a tin covering layer and is intended to prevent the diffusion of copper from the substrate into the tin layer. The intermediate layer substantially comprises copper with a nickel content of 20–40% by weight.

However, the solution described has only a limited lifespan. After the Cu/Ni layer has been consumed through the formation of an intermetallic (Cu—Ni) Sn phase, the usual mechanism commences within the intended service life. On account of the condensation of the vacancy streams in the material, the Kirkendall effect which has been described leads to the undesirable formation of areal peeling at the boundary layer with the Cu substrate.

Document U.S. 2003/0091855 A1 describes a layer structure comprising two intermediate layers and one covering layer, with a view to preventing complete transformation of the Sn covering layer into IMP and therefore ensuring that some Sn layer remains on the surface at high temperatures. However, the solution with a Cu intermediate layer as the only reaction layer promotes the Kirkendall effect, in particular at high temperatures, and therefore leads to the Sn layer flaking off the intermediate layer beneath it.

Therefore, the invention is based on the object, in particular for tin coatings, of improving the long-term bonding of the layer even with respect to long-term thermal age-hardening and of stabilizing the layer properties.

With regard to the layer sequence for production of a composite material, the invention is provided by the features of claim 1, and with regard to the process for producing the composite material the invention is provided by the features of claim 9. The further claims give advantageous configurations and refinements of the invention.

The invention encompasses the technical teaching with regard to a layer sequence on a substrate made from copper or a copper-based alloy, made from nickel or a nickel-based alloy or a copper-plated substrate for production of a composite material, in which a covering layer, consisting of tin or a tin-based alloy, which is arranged at least over part of the substrate, a barrier layer, which is located between the substrate and the covering layer and is in direct contact with the substrate, the barrier layer consisting of at least one element selected from the group consisting of Fe, Co, Nb, Mo or Ta, and an intermediate layer, which is located between the barrier layer and the covering layer and is in direct contact with the barrier layer, the intermediate layer consisting of at least one element selected from the group consisting of Cu and Ni, a reaction layer which is located between covering layer and intermediate layer and consists of Ag or an Ag alloy, of Pt or Pd or its alloys.

In this context, the invention is based on the consideration that further layers are introduced between the covering layer and the substrate. The outermost layer of the layer assembly is pure Sn or a Sn alloy which is selected according to the intended application. By way of example, a Sn-based alloy may be composed of 0–50% by weight of Sn and one or more of the elements Ag, Cu, Ni, In, Co, Bi, Pb and Sb. Beneath this, there is a reaction layer of Ag, Pd, Pt or their alloys, and beneath this there is the intermediate layer of Cu and Ni, and in turn beneath that is a barrier layer. The abovementioned elements of the barrier layer may also be used in the form of an alloy. A multiple layer sequence, for example a combination of Fe and Co or Ta and Co, is also conceivable. The layers are applied to copper or a Cu alloy, or a copper-plated component as substrate. The barrier layer consists of the abovementioned pure elements or of a mixture thereof.

The reaction layer, which consists of Ag, Pd or Pt or their alloys, reacts at high temperatures with the covering layer and, depending on the thickness, also with the intermediate layer, to form an intermetallic phase. This is the case, for example, if the reaction layer consists of Ag and the covering layer consists of Sn or its alloys. Therefore, depending on the thickness of the reaction layer and covering layer, the covering layer is refined and hardened without endangering the bonding strength in use under thermal loads.

The effect of this layer assembly preventing peeling of the covering layer is based on an intermetallic phase which reduces further diffusion of the layer components being formed at the interface between the Sn alloy and the reaction layer. After the reaction layer has been consumed through the formation of the intermetallic phase, if this occurs, a controlled reaction can occur with the intermediate layer, depending on the layer thickness. The diffusion stops at the barrier layer. Bright tin platings with durable bonding can be realized as the top covering layer without problems on these combinations of layers.

Consequently, there is no undesirable formation of areal peeling, which may occur as a result of condensation of the vacancy streams, at the boundary layer with the substrate or an intermediate layer. The solution according to the invention remedies the problem whereby the hitherto ineffectively utilized blocking effect of a separate barrier layer between substrate and reaction layer is utilized in conjunction with a Cu/Si layer. In principle, it would also be conceivable for a Sn layer to be applied directly, for example to a tantalum barrier layer, but this would only be functional with a considerable thickness of the barrier layer and only allows the deposition of a bright Sn layer to a limited extent. In this case, the bendability of the composite would be greatly restricted. Moreover, there is no refining of the Sn layer, for example by Ag, and therefore no stabilization of the contact resistance and the fretting resistance. Therefore, in these cases too at least one relatively thin reaction layer is introduced between barrier layer and Sn layer.

The Sn which diffuses through the reaction layer and intermediate layer is bonded at the barrier layer as a result of the reaction, for example with Fe, to form a further intermetallic phase, stopping further progress of the reaction. As a result, the formation of intermetallic phases from Cu and Sn at the interface with the substrate is suppressed for a usage time of 3000 h and temperatures of up to 200° C.

The desired barrier action is achieved even with a relatively low layer thickness. In a preferred configuration of the invention, the barrier layer may be from 0.2–1.0 µm thick. Layer thicknesses in this range may either be what are known as flash electroplating layers or layers which are deposited by means of PVD or CVD processes.

In a preferred embodiment, the intermediate layer may consist either of a Cu—Ni alloy or of a layer sequence comprising an Ni layer and a Cu layer. The intermediate layer is advantageously from 0.2–2.0 µm thick. With lower layer thicknesses, there is a risk of elements from the barrier layer diffusing to the surface and causing corrosion products with an undesirably poor conductivity.

The desired Sn layer can then be deposited on these base coatings by electroplating. In one embodiment, the covering layer is thicker than the reaction layer. Since some of the Sn layer is consumed by a subsequent heat treatment, however, it must be ensured that the remaining thickness of the Sn covering layer is still sufficient to completely cover the surface. The reaction layer advantageously has a layer thickness which corresponds to between 1/3 and 1/1 of the thickness of the covering layer, in order, for example at a ratio of 1:3, to ensure that free Sn still remains at the surface after 1000 h at 200° C.; at a ratio of 1:1, the entire Sn layer is refined to produce an IMP with the reaction layer. Optimum matching of the overall layer assembly is within the abovementioned thickness range. Layer thicknesses above the range indicated are not necessary to achieve the desired effect in conjunction with a barrier layer. Providing a layer thickness ratio of 1:1 allows simple and inexpensive production of SnAg or SnAgCu surfaces after a reflow treatment, with good electrical and mechanical properties.

Advantageously, however, the reaction layer may have a greater thickness than the barrier layer and the intermediate layer. To achieve the barrier action, in principle reduced layer thicknesses are required for the materials selected than for the reaction layer that is to be consumed. The intermediate layer together with the reaction layer already greatly inhibits the diffusion of Sn toward the base material, so that a barrier layer fraction even with a low barrier layer thickness is already sufficient to prevent the further diffusion of tin into the substrate.

It is advantageous for the total layer thickness on the substrate to be less than 12 µm, preferably less than 3 µm. Even such small layer thicknesses produce a durable and reliable Sn coating of a substrate made from copper or a copper alloy or a copper-plated substrate. At least one layer is advantageously an electroplating layer, a PVD layer or a CVD layer.

A further aspect of the invention proposes a process for producing a composite material from the layer sequence according to the invention by a heat treatment of the layer sequence at above the melting point of the covering layer (reflow treatment).

Therefore, substrate with barrier layer, intermediate layer and reaction layer and Sn layer can be subjected to a conventional reflow treatment in order to achieve mutual diffusion bonding of the layers. During the treatment, the layer sequence of the composite which is to be formed is heated for a sufficiently long period of time to above the melting point of the covering layer and then cooled. After a successful reflow treatment, interdiffusion has occurred between Sn layer and reaction layer and has led to the formation of the AgSn intermetallic phases, which are desirable to a certain extent. Interdiffusion has likewise occurred between intermediate layer and reaction layer, on the one hand, and barrier and intermediate layer, on the other hand, which improves the bonding of the barrier layer to the substrate and within the layer assembly. A composite material produced in this way is distinguished by the fact that no peeling effects caused by vacancy condensation are observed at temperatures of up to 200° C. and after up to 3000 h.

In a preferred embodiment of the invention, the heat treatment can be carried out in oil. The reflow treatment can be controlled uniformly and in a targeted way in particular by immersion in paraffin oil or ester oil, as a result of controlled heat transfer by means of convection in the liquid medium. Moreover, tin layers with self-lubricating properties can be produced in the same process. The composite material produced using the process according to the invention is preferably suitable for electromechanical components, leadframes and rigid and flexible printed circuit boards.

The advantages which are achieved with the invention, giving an effective barrier layer for Sn layers after long-time thermal age-hardening, consist in particular in the fact that there is no flaking of the overall layer and, at the same time effective protection against fretting is produced. Further advantageous properties of the layers according to the invention are a low contact resistance, resistance to corrosion and good solderability. Moreover, a bright Sn layer which is particularly resistant to frictional corrosion, is provided in particular after a reflow treatment.

Exemplary embodiments of the invention are explained in more detail on the basis of diagrammatic drawings, in which.

Corresponding parts are provided with identical reference numerals throughout the figures.

Figure 1:
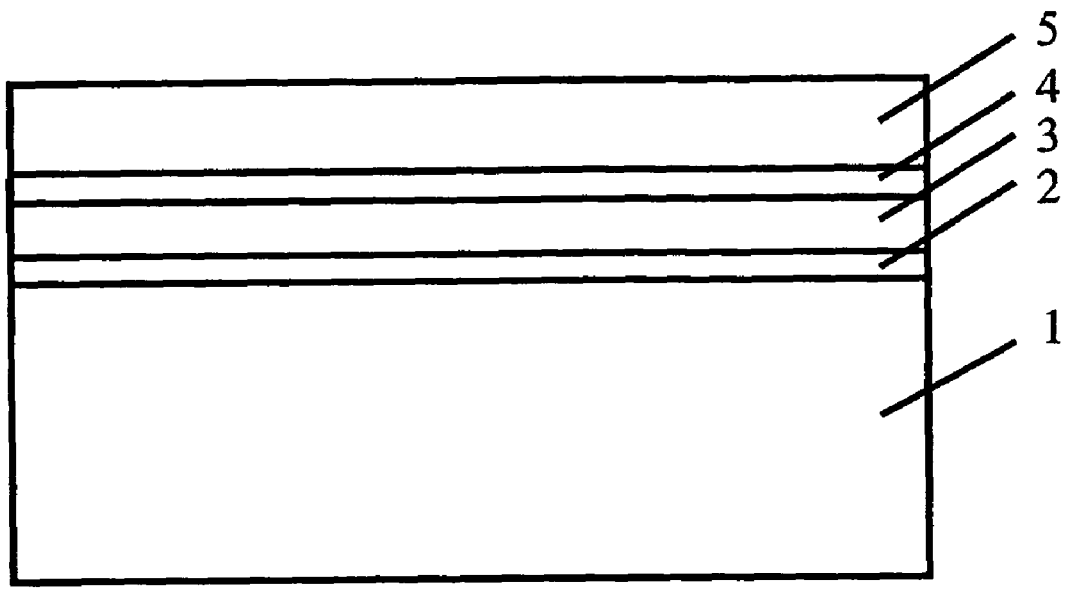
FIG. 1 shows a layer sequence on a substrate.

The layer sequence shown in FIG. 1 has been deposited on a substrate 1 made from copper or a copper-based alloy. The covering layer 5 consists of tin or a tin-based alloy which only partly covers the surface or, as illustrated in the figure, is arranged so as to cover the entire area. The barrier layer 2 is in direct contact with the substrate 1. The materials for the barrier layer 2 are selected from the group consisting of Fe, Co, Nb, Mo or Ta. The intermediate layer 3 and the reaction layer 4 are located between the covering layer 5 and the barrier layer 2; in the example, the intermediate layer 3 consists of a Cu/Ni alloy containing up to 40% by weight of Ni. The thickness of the reaction layer is approximately 1/3 of the thickness of the covering layer (5).

Figure 2:
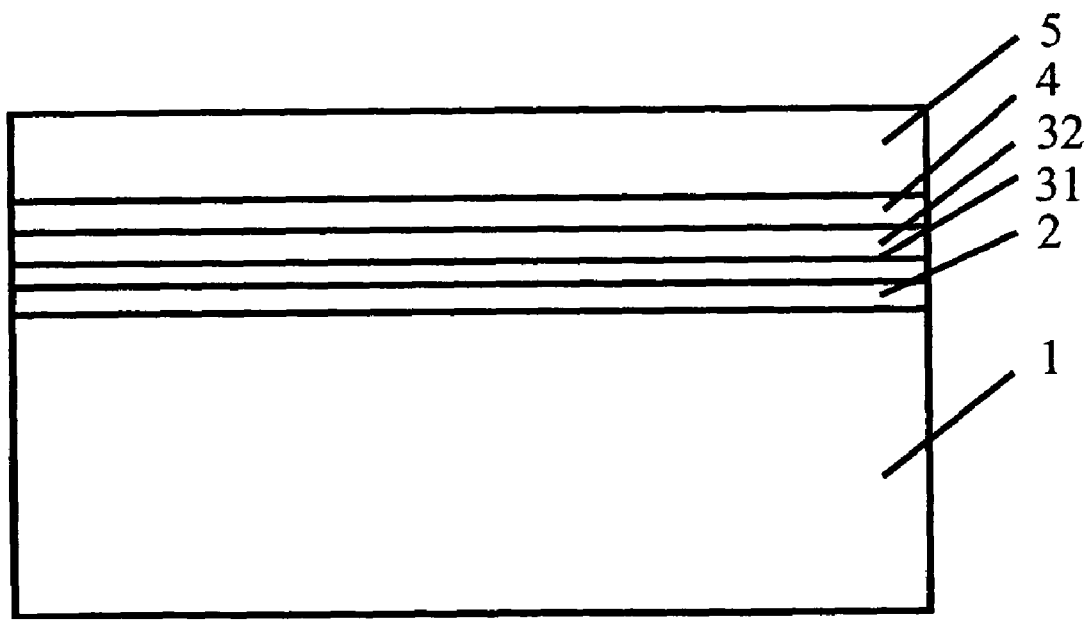
FIG. 2 shows a layer sequence according to the invention with a reaction layer comprising two individual layers.

FIG. 2 shows substantially the same layer sequence on the substrate 1, the difference being that the intermediate layer 3 is made up of two individual layers of nickel and copper. In the particularly preferred variant, the nickel layer 31 on one side is in direct contact with the barrier layer 2, and the copper layer 32 on the other side is in contact with the reaction layer 4, which consists of Ag.

The following exemplary embodiment serves to provide a more extensive explanation of the invention.

A strip of 0.2×32 mm of the Cu alloy C7025 (CuNi3Si1Mg) is coated with the layer sequence according to the invention. For this purpose, a Fe flash with a thickness of 0.5 μm is applied to the strip using an electroplating installation. What are known as flash layers are deposits with a relatively low layer thickness. A 0.6 μm nickel layer is applied to the Fe flash layer, followed by the deposition of a Cu flash with a thickness of 0.2 μm. The reaction layer used is a 0.5 μm Ag layer, and as the final layer a pure Sn layer with a thickness of 1.0 μm is deposited, and the layer assembly is subjected to a reflow treatment.

The composite material in strip form obtained is then stored at 125° C. and at 150° C. and tested at certain intervals. In the testing, it is established that, unlike in the known process of the prior art, no detachment caused by peeling is observed at 150° C. after 1000 h. The age hardening was continued until 3000 h, but there was still no indication of any peeling.

It has been found that the layer structure according to the invention makes it possible to achieve the desired durability of the tin plating even for periods of over 3000 h at temperatures of up to 170° C. Moreover, the formation of the SnAg$_3$ IMP keeps the contact resistance at a stable low level.

The invention claimed is:

1. A layer sequence on a substrate made from copper or a copper-based alloy, made from nickel or a nickel-based alloy or a copper-plated substrate, to produce a composite material, comprising:
    a covering layer consisting of tin or a tin-based alloy, which is arranged at least over part of the substrate;
    a barrier layer, which is located between the substrate and the covering layer and is in direct contact with the substrate, the barrier layer consisting of at least one element selected from the group consisting of Fe, Co, Nb, Mo or Ta;
    an intermediate layer, which is located between the barrier layer and the covering layer and is in direct contact with the barrier layer, the intermediate layer consisting of at least one element selected from the group consisting of Cu and Ni; and
    a reaction layer which is located between the covering layer and the intermediate layer, the reaction layer consisting of Ag or an Ag alloy, of Pt or Pd or their alloys, the reaction layer having a thickness which corresponds to a ratio of between 1/3 to 1/1 of the thickness of the covering layer.

2. The layer sequence as claimed in claim 1, wherein the barrier layer has a thickness from 0.2 μm to 4.0 μm.

3. The layer sequence as claimed in claim 1, wherein the intermediate layer is a Cu—Ni alloy or a layer sequence made up of a Ni layer and a Cu layer.

4. The layer sequence as claimed in claim 3, wherein the intermediate layer is from 0.2 μm to 2.0 μm thick.

5. The layer sequence as claimed in claim 1, wherein the reaction layer has a greater thickness than the barrier layer and the intermediate layer.

6. The layer sequence as claimed in claim 1, wherein total layer thickness on the substrate is less than 12 μm.

7. The layer sequence as claimed in claim 1, wherein at least one said layer is an electroplating layer, a PVD layer or a CVD layer.

8. A process for producing a composite material from the layer sequence as claimed in claim 1, which includes a heat treatment of the layer sequence at above the melting point of the covering layer.

9. The process for producing a composite material from the layer sequence as claimed in claim 8, wherein the heat treatment is carried out in oil.

10. A composite material, produced using the process as claimed in claim 8.

11. The use of the composite material as claimed in claim 10 for electromechanical components, leadframes and rigid and flexible printed circuit boards.

12. A layer sequence for producing a composite material comprising:
    a substrate that is made from nickel, a nickel-based alloy or that is copper-plated;
    a barrier layer directly contacting the substrate, the barrier layer including at least one element selected from the group Fe, Co, Nb, Mo and Ta;
    an intermediate layer directly contacting the barrier layer, the intermediate layer including at least one element of either Cu or Ni;
    a reaction layer directly contacting the intermediate layer and having a greater thickness than the barrier layer and the intermediate layer, the reaction layer including at least one of Ag, an Ag alloy, of Pt or Pd or their alloys; and
    a covering layer directly contacting the reaction layer, the covering layer including tin or a tin-based alloy.

13. The layer sequence as claimed in claim 12, wherein the reaction layer has a thickness that is from one third to the same thickness as the thickness of the covering layer.

14. The layer sequence as claimed in claim 12, wherein total layer thickness on the substrate is less than 3 μm.

15. The layer sequence as claimed in claim 12, wherein the barrier layer has a thickness from 0.2 to 4.0 μm and the intermediate layer has a thickness from 0.2 to 2.0 μm.

* * * * *